United States Patent

Martino, Jr. et al.

[11] 4,291,246
[45] Sep. 22, 1981

[54] DIFFERENTIAL CAPACITIVE BUFFER

[75] Inventors: William L. Martino, Jr.; Jerry D. Moench, both of Austin, Tex.

[73] Assignee: Motorola Inc., Schaumburg, Ill.

[21] Appl. No.: 17,524

[22] Filed: Mar. 5, 1979

[51] Int. Cl.³ .................. H03K 5/01; H03K 3/356; H03K 17/30; G11C 8/00

[52] U.S. Cl. .................. 307/475; 307/279; 365/230

[58] Field of Search .............. 307/205, 264, 270, 279, 307/291, DIG. 1, DIG. 4, DIG. 5; 365/202, 203, 189, 208, 230

[56] References Cited

U.S. PATENT DOCUMENTS

| | | | |
|---|---|---|---|
| 3,987,315 | 10/1976 | Matsue | 307/DIG. 1 X |
| 4,023,050 | 5/1977 | Fox et al. | 307/DIG. 1 X |
| 4,031,415 | 6/1977 | Redwine et al. | 365/208 X |
| 4,077,031 | 2/1978 | Kitagawa et al. | 307/279 X |
| 4,110,639 | 8/1978 | Redwine | 307/DIG. 1 X |
| 4,110,842 | 8/1978 | Sarkissian et al. | 307/279 X |
| 4,149,099 | 4/1979 | Nagami | 307/279 |

OTHER PUBLICATIONS

Furman, "Address Buffer True/Complement Generator"; IBM Tech. Discl. Bull.; vol. 18, No. 11, pp. 3597-3598; 4/76.
Hibred, "Integrated Circuits", Texas Inst. Electronic Series; p. 38; McGraw-Hill Book Co. 1969.

*Primary Examiner*—Larry N. Anagnos
*Attorney, Agent, or Firm*—Anthony J. Sarli, Jr.; Vince Ingrassia; Jeffrey Van Myers

[57] ABSTRACT

A balanced differential circuit is provided which is useful as an address buffer in digital memories. The circuit is illustrated as a single ended input circuit having complementary outputs. Capacitors are used to couple imbalancing signals into the circuit. Through selective timing of load devices within the circuit power dissipation is kept to a minimum.

10 Claims, 2 Drawing Figures

DIFFERENTIAL CAPACITIVE BUFFER

This invention relates, in general, to balanced differential type circuits, and more particularly, to a balanced differential type circuit useful as an address buffer.

Differential buffers or amplifiers are widely used in electronic circuits particularly in semiconductor digital memories. These buffers are used in random access memories (RAM) for translating address signals from a TTL level to MOS levels. The address buffer must be capable of responding quickly and with little power dissipation. In addition, the address buffer should impose a minimum of current loading on external circuits and should only be responsive to the incoming address signal for a short period of time during the operating cycle of the digital equipment so that the address signal may change to set up the next access cycle before the existing cycle is completed.

In the past, many address buffer circuits have been used. Some prior art differential circuits, which were single ended input circuits, required a reference potential for the second input of the differential circuit. Since generating a reference potential uses up space on a silicon chip and dissipates power, it would be preferable to eliminate the requirement for a reference potential. Another popular type of circuit used was an imbalanced differential or flip-flop type circuit. The circuit was unbalanced by making one of the cross coupled transistors larger than the other or by making one of the load devices larger than the other so that in a quiescent state the circuit would always assume a given state. An imbalanced type of circuit is believed to be less preferable than a balanced type circuit since the imbalance is created by internal component sizes. Component sizes are process dependent and therefore can vary from a desired size during the manufacturing process. In certain situations the process variations may vary in such a manner as to reduce the imbalance of the circuit which could result in marginal operation. Although a balanced circuit may also experience process variations it is believed that these will be of a minimum effect, especially, when the balanced circuit is intentionally driven to an unbalanced state just prior to the circuit being responsive to an incoming signal. An imbalanced address buffer circuit is disclosed in U.S. Pat No. 4,110,639 which issued to D. J. Redwine.

Accordingly, it is an object of the present invention to provide a balanced differential or flip-flop buffer circuit which operates at high speed and yet has low power dissipation.

Another object of the present invention is to provide a balanced buffer circuit which capacitively couples unbalancing signals into the buffer to provide a predetermined quiescent state.

Yet another object of the present invention is to provide a balanced differential type circuit which has single ended input and yet does not require a reference potential.

SUMMARY OF THE INVENTION

In carrying out the above and other objects in one form, there is provided a balanced amplifier or buffer having at least one input in the form of a single ended input and differential outputs. The circuit includes a cross-coupled flip-flop or differential amplifier having capacitors for coupling an imbalance signal to the circuit to provide a predetermined quiescent state to the buffer.

DETAILED DESCRIPTION OF THE INVENTION

Figure 1:
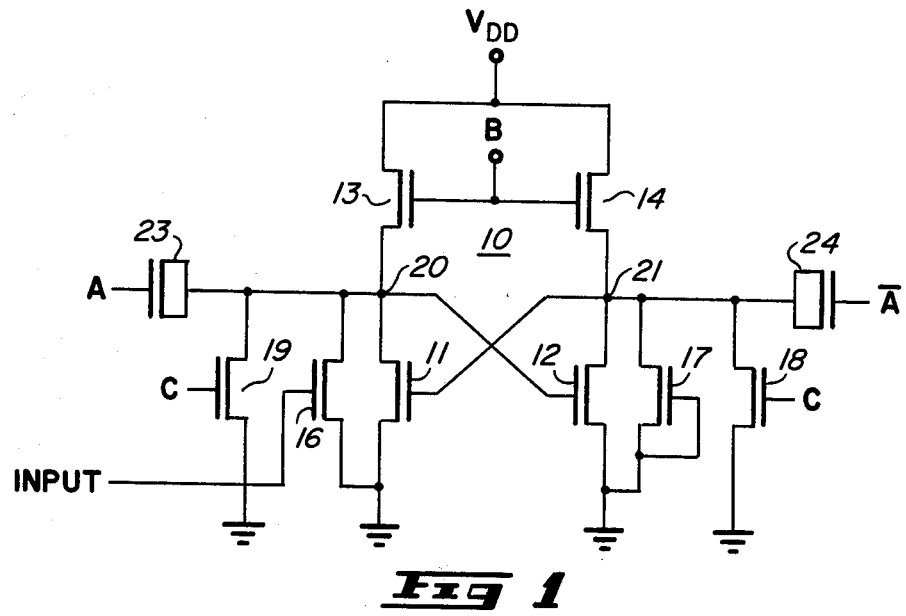
FIG. 1 is a schematic drawing of the invention in one form thereof.

As the term is used herein, a "balanced" circuit is meant to be a circuit which is substantially balanced within the limitations of process variations. A differential capacitive address buffer in FIG. 1 illustrates an embodiment of the present invention. Circuit 10 is useful for translating address signals from a TTL level to a MOS level. A pair of cross-coupled transistors 11 and 12 have load devices 13 and 14. As will be understood by those skilled in the art the cross-coupled transistors are arranged so that transistor 11 has its control electrode connected to a first current carrying electrode of transistor 12, and transistor 12 has its control electrode connected to a first current carrying electrode of transistor 11. Transistors 11 and 12 each have second current carrying electrodes which are connected together to a reference potential illustrated as ground in FIG. 1. The connection of the control electrode of transistor 12 to the first current carrying electrode of trasistor 11 forms a node 20, and the connection of the control electrode of transistor 11 to the first current carrying electrode of transistor 12 forms a node 21. First load device 13, illustrated as a field effect transistor, is connected between node 20 and a voltage potential $V_{DD}$. Second load device 14, illustrated as a field effect transistor, is connected between voltage $V_{DD}$ and node 21. Load devices 13 and 14 are gated on or enabled by a timing signal B which is coupled to each of their control or gate electrodes. Transistors 13 and 14 could be gated by separate signals, however, in the preferred embodiment they are gated by the same signal B.

An input transistor 16 is coupled in parallel with transistor 11. Transistor 16 has a control or gate electrode which receives an input signal and serves as the input for buffer 10. Transistor 17 is in parallel with transistor 12 and has its gate electrode connected to the reference potential, illustrated as ground. Transistor 17 serves as a balancing transistor to balance the circuit parameters effected by the existence of transistor 16.

Flip-flip circuit 10 also has a transistor 19 coupled between node 20 and reference potential ground. On the other side of circuit 10, transistor 18 is coupled between node 21 and reference potential ground. Both transistors 18 and 19 have their gates or control electrodes connected to an enabling signal C. The purpose of transistors 18 and 19 is to precharge nodes 20 and 21. When transistors 18 and 19 are enabled reference potential ground will be applied to nodes 20 and 21 thereby resetting circuit 10. Nodes 20 and 21 serve as outputs of circuit 10 and are complements of each other.

A timing signal A is coupled to node 20 by capacitor 23. A timing signal $\overline{A}$ is coupled to node 21 by capacitor 24. Capacitors 23 and 24 are balanced diffusion type capacitors. Timing signals A and $\overline{A}$ serve as imbalancing signals to unbalance circuit 10. As an example, if signal A goes to a high voltage level and the input signal is low, capacitor 23 couples its high level to node 20 which enables transistor 12 thereby placing node 21 at approximately reference potential ground. If signal B, going to the gate electrodes of transistors 13 and 14, is of the right amplitude, transistors 13 and 14 will be enabled. However, transistor 14 being enabled will have no effect upon node 21 since transistor 12 will hold node 21 at the reference potential. Transistor 11 will not be enabled since its gate electrode is tied to node 21. Since transistor 11 is not enabled node 20 will tend to rise towards voltage potential $V_{DD}$.

Figure 2:
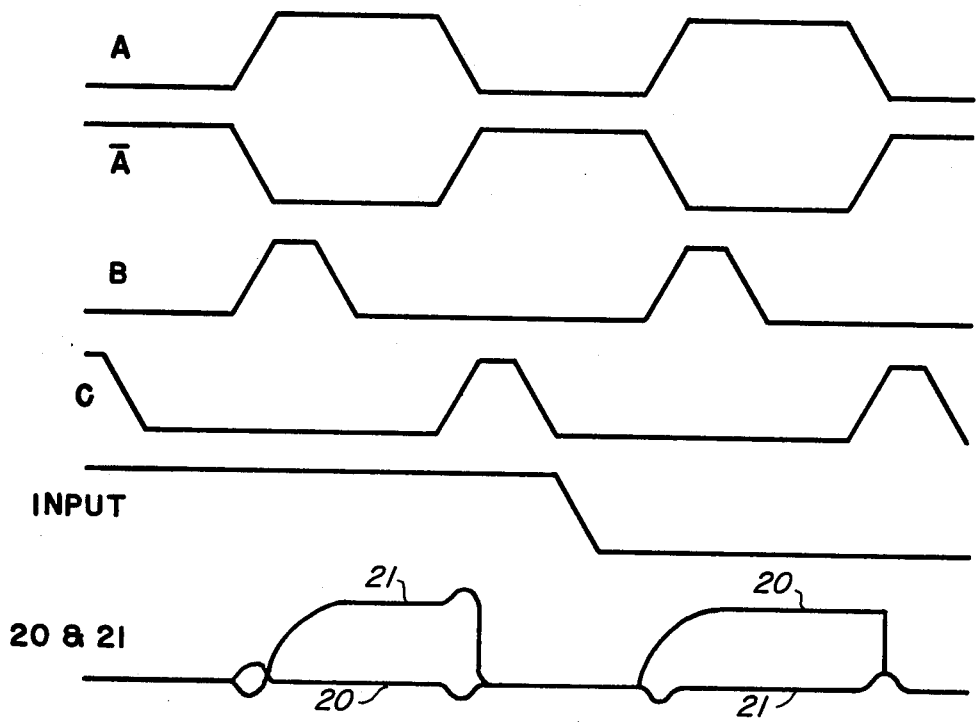
FIG. 2 is a timing diagram useful in understanding the operation of the circuit of FIG. 1.

The operation of the circuitry of FIG. 1 will now be discussed in greater detail using the time-voltage chart of FIG. 2. Note that signals A and $\overline{A}$ are complements of each other and that signal B goes high during the beginning high portion of signal A. Signal B is of a short time duration to minimize any unnecessary DC current flow in differential amplifier or buffer 10. If transistors 13 and 14 are enabled for a short period of time, then current will flow from voltage potential $V_{DD}$ only for that short period of time. Timing signal C controls transistors 18 and 19, and is in a high state only during the beginning of the high state of signal $\overline{A}$. Transistors 18 and 19 only have to be enabled long enough to discharge nodes 20 and 21.

When the input signal to the gate electrode of transistor 16 is high and signal B goes high, transistors 13, 14 and 16 are enabled. When transistor 16 is enabled reference potential ground is applied to node 20 which is also connected to the gate electrode of transistor 12. When transistor 16 is enabled it holds node 20 at ground thereby preventing signal A from causing node 20 to rise. Since transistor 12 is not energized, node 21 will tend to rise towards voltage $V_{DD}$ since transistor 14 is enabled by signal B being high. As node 21 rises towards voltage $V_{DD}$, transistor 11 is enabled thereby maintaining node 20 at reference potential ground. As can be seen in FIG. 2, node 20 stays at reference potential ground while node 21 goes to a high voltage level. However, when signal C commences to go high, nodes 20 and 21 are precharged, or in the case as illustrated in FIG. 1, are discharged to reference potential ground. When the input signal to the gate of transistor 16 is low, and as time progresses, signal A goes high again and node 20 will start going high which enables transistor 12 to hold node 21 at reference potential ground. Since the gate electrode of transistor 11 is tied to node 21 transistor 11 will not conduct thereby allowing node 20 to now also be impressed with voltage from voltage potential $V_{DD}$ when transistor 13 is enabled by signal B. Node 20 remains at a high level until signal C once again enables transistors 18 and 19.

By now it should be appreciated that there has been provided a balanced differential or flip-flop circuit 10 having balanced cross-coupled transistors 11 and 12, along with load transistors 13 and 14. An input transistor 16 is balanced by transistor 17, and transistors 18 and 19 balance each other. Capacitors 23 and 24 are also balanced and serve to couple imbalancing signals into circuit 10. Capacitors 23 and 24 serve to isolate circuit 10 from the loading effects of the lines carrying signals A and $\overline{A}$. Power dissipation in circuit 10 is kept to a reduced level by selective gating of load devices 13 and 14. It will also be noted that differential circuit 10 has a single ended input and yet does not require an input reference voltage.

We claim:

1. A buffer circuit useful in a digital memory and having a single ended input and providing complementary outputs, comprising:

a first and a second cross-coupled field effect transistor; a first load device coupled to the first transistor;

a second load device coupled to the second transistor;

an input transistor coupled in parallel to the first transistor and having a control electrode for receiving the input; and a first and a second capacitor, the first capacitor being coupled to the second transistor for applying a first control signal to the second transistor, and the second capacitor being coupled to the first transistor for applying a second control signal to the first transistor.

2. A buffer circuit useful in a digital memory and having a single ended input in providing complementary outputs, comprising:

a first and a second cross-coupled field effect transistor;

a first load device coupled to the first transistor;

a second load device coupled to the second transistor;

an input transistor coupled in parallel to the first transistor and having a control electrode for receiving the input;

a first and a second capacitor, the first capacitor being coupled to the second transistor for applying a first control signal to the second transistor, and the second capacitor being coupled to the first transistor for applying a second control signal to the first transistor; and a third transistor in parallel with the second transistor to provide balanced symmetry of the buffer circuit.

3. A buffer circuit useful in a digital memory and having a single ended input and providing complementary outputs, comprising:

a first and a second cross-coupled field effect transistor;

a first load device coupled to the first transistor;

a second load device coupled to the second transistor;

an input transistor coupled in parallel to the first transistor and having a control electrode for receiving the input.

a first and a second capacitor, the first capacitor being coupled to the second transistor for applying a first control signal to the second transistor, and the second capacitor being coupled to the first transistor for applying a second control signal to the first transistor; and a first reset transistor in parallel with the input transistor and a second reset transistor in parallel with the second transistor, the first and second reset transistors being controllable by an enabling signal to enable the first and second transistors at a predetermined time.

4. A buffer circuit useful in a digital memory having a single ended input and providing complementary outputs, comprising:

a first and a second cross-coupled field effect transistor;

a first load device coupled to the first transistor;

a second load device coupled to the second transistor;

an input transistor coupled in parallel to the first transistor and having a control electrode for receiving the input;

a first and a second capacitor, the first capacitor being coupled to the second transistor for applying a first control signal to the second transistor, and the second capacitor being coupled to the first transistor for applying a second control signal to the first transistor; and wherein the first and second load devices are each a field effect transistor each having a control electrode commonly coupled to a timing signal.

5. An electronic circuit having a balanced flip-flop with controllable load devices and having an input, a first and a second output, and first and second voltage terminals, comprising: an input field effect transistor coupled to the input, a balancing field effect transistor coupled to the second output and having a first current carrying electrode and a control electrode coupled to the second voltage terminal; a first capacitor coupled to the first output for coupling a first unbalancing signal into the flip-flop; and a second capacitor coupled to the second output for coupling a second unbalancing signal into the flip-flop.

6. The electronic circuit of claim 5 having a first field effect transistor coupled to the first output for precharging the first output to a predetermined voltage level, and a second field effect transistor coupled to the second output for precharging the second output to the predetermined voltage level.

7. The electronic circuit of claim 5 wherein the first and second unbalancing signals are complements of each other.

8. A buffer circuit comprising:

a first field effect transistor having a source, drain, and control electrode;

a second field effect transistor having a source, drain and control electrode; which has its control electrode coupled to the drain of the first field effect transistor, its drain coupled to the control electrode of the first field effect transistor, and its source coupled to the source of the first field transistor;

a first load device coupled to the first transistor;

a second load device coupled to the second transistor;

an input transistor coupled in parallel to the first transistor and having a control electrode for receiving an input signal;

capacitance means for capacitively coupling an unbalancing signal to the control electrode of at least one of the first and second transistors.

9. The buffer circuit of claim 8 further comprising:

a first reset means coupled to a control electrode of the second transistor for resetting the control electrode of the second transistor to a predetermined voltage level; and a second reset means coupled to a control electrode of the first transistor for resetting the control electrode of the first transistor to the predetermined voltage level.

10. The buffer circuit of claim 9 further comprising a third transistor coupled in parallel to the second transistor with a control electrode of the third transistor biased to provide balanced symmetry to the input transistor.

* * * * *